United States Patent [19]

Sloan

[11] 4,180,749
[45] Dec. 25, 1979

[54] INPUT BUFFER FOR INTEGRATED INJECTION LOGIC CIRCUITS

[75] Inventor: Benjamin J. Sloan, Richardson, Tex.
[73] Assignee: Texas Instruments Incorporated, Dallas, Tex.
[21] Appl. No.: 816,408
[22] Filed: Jul. 18, 1977
[51] Int. Cl.² .................................... H03K 19/08
[52] U.S. Cl. ........................ 307/299 B; 307/203; 307/DIG. 1; 357/15
[58] Field of Search ......... 307/299 A, 299 B, DIG. 1, 307/203–214; 357/15

[56] References Cited

U.S. PATENT DOCUMENTS

| | | | |
|---|---|---|---|
| 3,790,817 | 2/1974 | Dobkin | 307/299 B |
| 4,013,898 | 3/1977 | Makino | 307/299 B |
| 4,081,822 | 3/1978 | Dao et al. | 307/299 B |

*Primary Examiner*—Stanley D. Miller, Jr.
*Assistant Examiner*—B. P. Davis
*Attorney, Agent, or Firm*—James T. Comfort; Rene' E. Grossman; Gary C. Honeycutt

[57] ABSTRACT

An input buffer gate for integrated injection logic (I²L) circuits, including a multiple-collector transistor wherein a first collector is electrically common with the base thereof, a second (Schottky) collector is connected to receive an input signal, and a third collector which drives internal I²L gates. The buffer has a high input breakdown voltage, virtually no input capacitance, power-up/power-down capability at logic "1" and virtually no input current at logic "0", very low storage time, and an input "1" threshold of about 0.5 volts.

7 Claims, 5 Drawing Figures

INPUT BUFFER FOR INTEGRATED INJECTION LOGIC CIRCUITS

This invention relates to integrated injection logic ($I^2L$) circuits, and more particularly to an input buffer gate for such circuits capable of providing direct compatibility with other logic families, such as transistor-transistor logic (TTL).

It is often necessary to interface $I^2L$ circuits with other logic families which typically operate at voltage levels that are too high to permit direct interconnection compatibility. For example, in order to drive a non-isolated $I^2L$ circuit with a signal derived from a 5 volt TTL system, the usual practice has been to provide a resistor-transistor gate between the two systems which increases the $I^2L$ input logic "1" threshold according to the ratio of the two input resistors, and also allows the input to increase significantly beyond the logic "1" level, thereby permitting compatibility between the two logic systems.

The resistor-transistor input has several disadvantages. It is slow due to the time constant associated with input resistance and capacitance, and also due to the storage time of the input transistor. Moreover, the input power requirements are determined by the two resistors and cannot be changed after fabrication. This is disadvantageous because the power and speed of $I^2L$ devices can be varied over several orders of magnitude to suit a particular application by varying the injector current. Still further, if speed of the RTL input were to be increased through the use of capacitive coupling around the input series resistor, the sensitivity to AC noise would increase, and bar size and processing complexity may also be increased.

Accordingly, it is an object of the present invention to provide an input buffer gate for integrated injection logic circuits which provides high input breakdown voltage, virtually no input capacitance, input current requirements which depend upon internal injector current at logic "1", virtually no input current at logic "0", low storage time, and an input "1" threshold of about 0.5 volts. It is a further object to provide such an input buffer gate with further flexibility to provide low output voltage, when speed is not of primary importance.

One aspect of the present invention is based upon the fact that a feedback collector (collector electrically common with base) can set the effective gain of a multicollector $I^2L$ gate. It is known further that the effective upward gain (the current gain in the normal $I^2L$ direction ... collector at the silicon surface) of the Nth collector of an N-collector $I^2L$ gate is dependent on the downward gain of any of the (N−1) collectors which are saturated (collector-base junction forward biased). This phenomenon is referred to as "current hogging" in an $I^2L$ gate, and is described by Bergen and Wiedmann: Merged Transistor Logic, IEEE Journal of Solid State Circuits, October 1972, pp. 340–346. The downward gain of the N collectors is determined, among other things, by the carrier concentration in the collector region and can be small for a Schottky collector device. This, in a multicollector transistor having a low gain (beta-down) Schottky collector, the apparent gain of the other collectors can be controlled by the degree of saturation (collector to base voltage) of the Schottky collector, i.e., when it saturates, the beta-up to all other collectors approaches zero.

Accordingly, the invention is embodied in a circuit for achieving compatibility between first and second systems operating from different supply voltages, comprising a multiple-collector transistor wherein a first collector is made electrically common with the base thereof; a second Schottky collector is connected to receive a relatively high voltage signal from said first system, and a third collector of said transistor is connected to provide a lower voltage output signal, compatible with said second system. Such a multiple-collector transistor is capable of functioning as an input buffer gate for interfacing conventional 5 volt logic circuits with non-isolated $I^2L$ circuits.

As shown in FIG. 1, the first collector $S_1$ has a feedback configuration, which determines the gain of the buffer gate when the other collectors are not saturated.

The second collector $S_2$ is a Schottky junction connected to receive the input voltage signal from a first system such as a TTL system. $S_2$ is provided dimensions such that when it saturates, the base drive to the third collector $S_3$ goes essentially to zero. $S_2$ has very low input capacitance and is provided with little or no collector impurity doping except that provided by the epitaxial layer so that its offset voltage (collector-emitter voltage when saturated) is high (about 0.5 volts) which determines the input threshold of the gate. Input $S_2$ is TTL voltage compatible, since it has a high breakdown voltage and is not clamped as would be the case when using the transistor vase terminal as an input. Also, its input current requirement is tied directly to the injector current of the $I^2L$ system (and the sizes of collectors $S_1$ and $S_2$) and thus will powerdown, unlike a resistor-transistor input.

The third collector, $S_3$, which drives the internal $I^2L$ gates is preferably also a Schottky collector having a convenient size chosen to provide appropriate gain and current handling capability. An N+ collector is also within the scope of the invention and will provide lower output voltage at the expense of a slight loss of speed.

Figure 1:
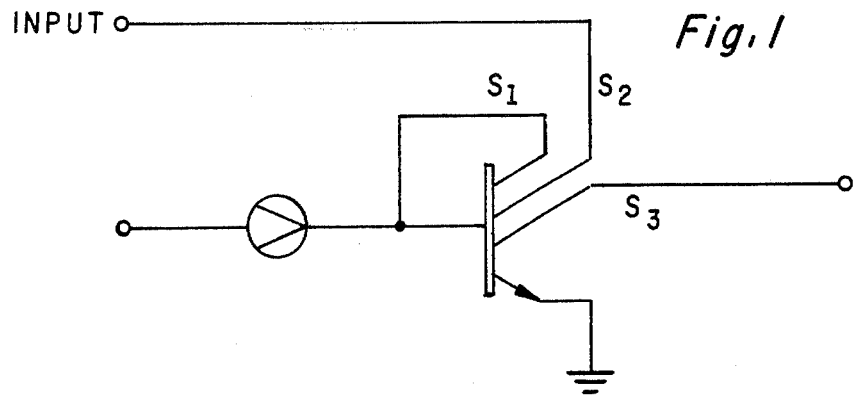
Figure 2:
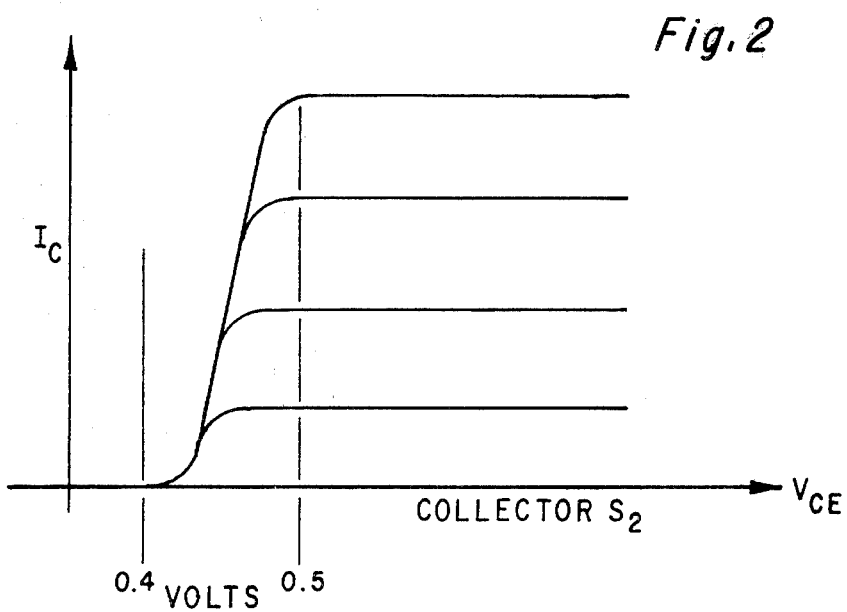
FIG. 2 is a plot of collector $S_2$ Ic versus Vce characteristics which determine the threshold of the gate.

An N-type epitaxial layer 12 is grown on the substrate to a thickness of about 1 to 2 microns, and having a resistivity of about 0.5 to 1.0 ohm centimeter. Guard ring 13 is then formed through substantially the entire thickness of the epitaxial layer. Region 13 may be diffused or implanted to form a low-resistivity N-type region, or in the alternative, region 13 may consist of a dielectric guard ring of silicon dioxide, for example.

P+ regions 14 and 15 are then formed within that portion of epi layer 12 defined by guard ring 13, to form, respectively, the current injector and the extrinsic base of the multiple-collector transistor. For example, regions 14 and 15 are formed by the selective diffusion of boron to a depth of about ½ micron and with a sheet resistance of about 50 to 100 ohms per square. The active base regions 16a through 16c are then formed by selective ion implantation of boron at an energy of about 400–600 KEV and a dosage of about $2 \times 10^{12}$ ions per square centimeter. Region 17 is then formed by an optional selective implantation of arsenic or antimony, at low dosage, to increase the charge in the epi layer sufficient to control the punch-through breakdown voltage of the Schottky collector junction. N+ collectors 18 and 19 are then formed by selective ion implantation and diffusion of arsenic, for example, with a dosage sufficient to provide a sheet resistance of about 50 ohms per square. Collector 19 can also be a Schottky collector, as Region 17, previously described, providing some increase in speed.

The device is then ready for the opening of windows in the oxide at selected locations for ohmic contact to regions 14, 15, 18, and 21, respectively, and for Schottky contact 20. The device is then completed by depositing and patterning metallization in accordance with known methods.

The ratio of the areas of $S_1:S_2:S_3$ is selected for the purpose of determining device gain, and for the purpose of design such that the base drive to $S_3$ will approach zero when $S_2$ saturates, and for providing adequate current handling capability. For example, a ratio of 1:10:10 has been found suitable, and a specific embodiment having an $S_1$ area of 0.05 square mil has been fabricated. Such a ratio and dimensions are illustrative only, and are not intended to limit the scope of the invention.

Figure 3:
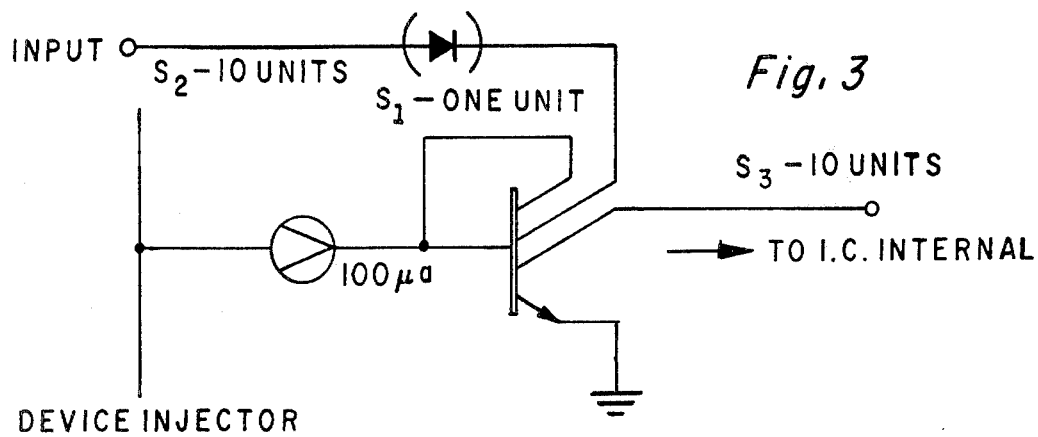
FIG. 3 is a variation of the gate, which utilizes an optional input diode to increase logic "1" threshold voltage.
Figure 4:
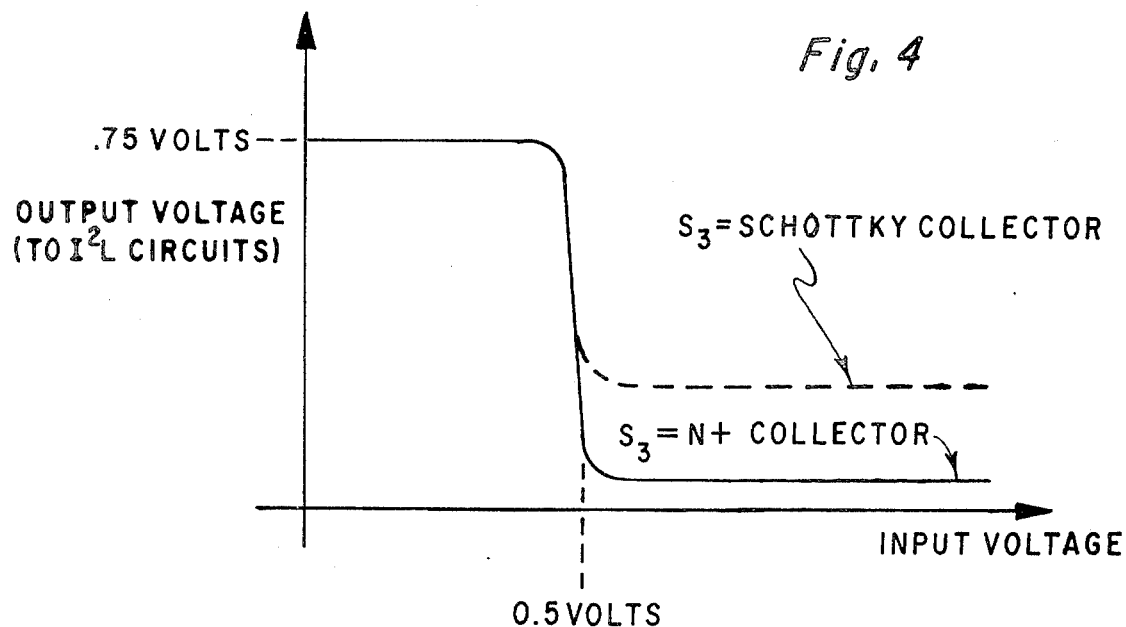
FIG. 4 is a plot of the transfer voltage characteristic between input $S_2$ and output $S_3$.
Figure 5:
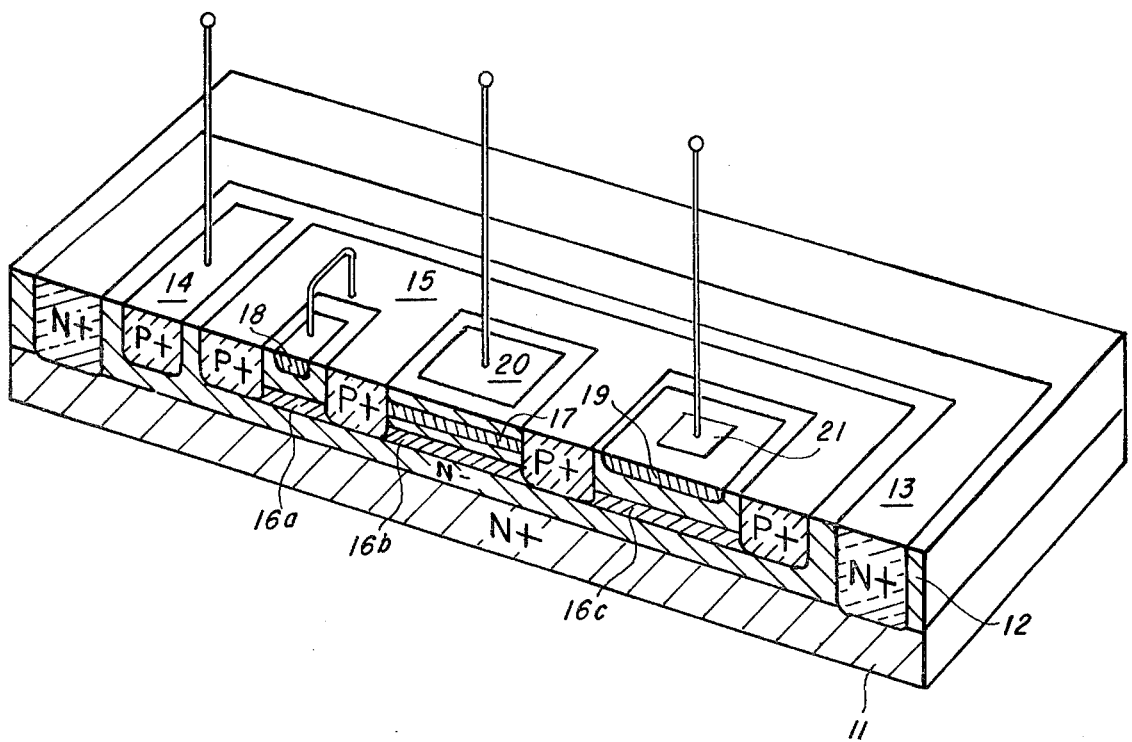
FIG. 5 is an enlarged perspective view, partly in cross section, of a device embodying the invention. Fabrication of the device begins with the selection of a monocrystalline silicon substrate 11 of N-type conductivity having a resistivity of about 0.01 ohm-centimeter.

The optional input diode illustrated in FIG. 3 is useful only when it becomes necessary to increase the logic "1" threshold voltage. Such a diode is readily integrated into the device of the invention, as will be apparent to those skilled in the art.

What is claimed is:

1. A circuit for achieving compatibility between first and second systems operating at different voltage levels, comprising an inverted multiple-collector transistor wherein a first collector thereof is electrically common with the base thereof, a second collector including a Schottky barrier is connected to receive a relatively high-voltage signal from said first system, and a third collector is connected as the input to a second system and provides a lower-voltage signal compatible with said second system.

2. A circuit as in claim 1 further including forward-biased rectifying means in the input line to said second collector.

3. A circuit as in claim 1 wherein said second collector is a metal-semiconductor barrier.

4. A circuit as in claim 1 wherein the area of the second collector is about three times that of the third collector.

5. An integrated circuit comprising an inverted, multiple-collector transistor and a complementary lateral transistor, the emitter of the former being electrically common with the base of the latter, and the collector of the latter being common with the base of the former, said multiple collectors including a first collector coupled to the base of the inverted transistor, a second collector comprising a Schottky barrier, coupled to receive a relatively high voltage input signal, and a third collector coupled to an integrated injection logic system as an input thereto, whereby the degree of saturation of the Schottky collector controls the gain of the other collectors.

6. A circuit as in claim 5 wherein the ratio of areas of said first, second and third collectors is such that the base drive to the third collector approaches zero when the second collector saturates.

7. A circuit as in claim 6 wherein the ratio of said areas is 1:10:10, respectively.

* * * * *